(12) United States Patent
Egashira et al.

(10) Patent No.: US 10,366,877 B2
(45) Date of Patent: Jul. 30, 2019

(54) SUBSTRATE PROCESSING METHOD AND SUBSTRATE PROCESSING APPARATUS

(71) Applicant: Tokyo Electron Limited, Tokyo (JP)

(72) Inventors: Keisuke Egashira, Kumamoto (JP); Mitsunori Nakamori, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 2 days.

(21) Appl. No.: 15/284,625

(22) Filed: Oct. 4, 2016

(65) Prior Publication Data
US 2017/0103881 A1    Apr. 13, 2017

(30) Foreign Application Priority Data
Oct. 8, 2015   (JP) .................................. 2015-200493

(51) Int. Cl.
| | | |
|---|---|---|
| *B08B 3/08* | (2006.01) | |
| *H01L 21/02* | (2006.01) | |
| *H01L 21/67* | (2006.01) | |
| *C11D 11/00* | (2006.01) | |

(52) U.S. Cl.
CPC ............ *H01L 21/0206* (2013.01); *B08B 3/08* (2013.01); *C11D 11/0047* (2013.01); *H01L 21/02057* (2013.01); *H01L 21/67028* (2013.01); *H01L 21/67051* (2013.01)

(58) Field of Classification Search
CPC ........... H01L 21/0206; H01L 21/02057; H01L 21/67028; H01L 21/67051; C11D 11/0047; B08B 3/08
See application file for complete search history.

(56) References Cited

U.S. PATENT DOCUMENTS

| | | | | |
|---|---|---|---|---|
| 2007/0177870 A1* | 8/2007 | Hamada | ............ | H01L 21/67051 396/611 |
| 2008/0076232 A1* | 3/2008 | Hozawa | ............ | H01L 21/02046 438/460 |
| 2008/0314870 A1* | 12/2008 | Inoue | ....................... | B08B 1/04 216/38 |
| 2009/0311874 A1* | 12/2009 | Tomita | .............. | H01L 21/02057 438/759 |
| 2011/0143545 A1* | 6/2011 | Okuchi | ............. | H01L 21/02057 438/706 |

(Continued)

FOREIGN PATENT DOCUMENTS

| | | |
|---|---|---|
| JP | 08-236497 A | 9/1996 |
| JP | 2000-195839 A | 7/2000 |

(Continued)

*Primary Examiner* — Sharidan Carrillo
(74) *Attorney, Agent, or Firm* — Abelman, Frayne & Schwab

(57) ABSTRACT

Disclosed is a substrate processing method including a first surface cleaning step of supplying a first cleaning liquid containing water to a first surface of a substrate; a second surface cleaning step of supplying a second cleaning liquid containing water to a second surface that is opposite to the first surface; a water removal step of removing the water remaining on the second surface of the substrate in a state where the first surface is not exposed to outside air, after the second surface cleaning step; a water-repellency step of supplying a water-repellent agent to the first surface of the substrate after the water removal step; and a drying step of drying the substrate after the water-repellency step.

8 Claims, 14 Drawing Sheets

(56) References Cited

U.S. PATENT DOCUMENTS

| | | | | |
|---|---|---|---|---|
| 2012/0045581 A1* | 2/2012 | Kimura | ............ | H01L 21/02057 |
| | | | | 427/248.1 |
| 2012/0118334 A1* | 5/2012 | Okuchi | ................. | B01D 53/72 |
| | | | | 134/95.3 |
| 2014/0206202 A1* | 7/2014 | Kimura | ............ | H01L 21/67028 |
| | | | | 438/761 |
| 2016/0289455 A1* | 10/2016 | Inaoka | ................. | H01L 21/0206 |
| 2016/0293400 A1* | 10/2016 | Kimura | ............ | H01L 21/02057 |
| 2017/0043379 A1* | 2/2017 | Sasaki | ....................... | B08B 3/00 |
| 2017/0103881 A1* | 4/2017 | Egashira | ................... | B08B 3/08 |

FOREIGN PATENT DOCUMENTS

| | | |
|---|---|---|
| JP | 2008-153422 A | 7/2008 |
| JP | 2010-114414 | 5/2010 |
| JP | 2011-071169 A | 4/2011 |
| JP | 2012-222329 A | 11/2012 |
| JP | 2015-088598 A | 5/2015 |
| TW | 201306115 A | 2/2013 |

* cited by examiner

SUBSTRATE PROCESSING METHOD AND SUBSTRATE PROCESSING APPARATUS

CROSS-REFERENCE TO RELATED APPLICATIONS

This application is based on and claims priority from Japanese Patent Application No. 2015-200493 filed on Oct. 8, 2015 with the Japan Patent Office, the disclosure of which is incorporated herein in its entirety by reference.

TECHNICAL FIELD

Exemplary embodiments disclosed herein relate to a substrate processing method and a substrate processing apparatus.

BACKGROUND

Conventionally, in a drying processing that removes a processing liquid remaining on a substrate such as, for example, a silicon wafer or a liquid crystal substrate, a pattern collapse may occur by the surface tension of the processing liquid acting on the pattern formed on a front surface of the substrate.

Hence, a technique of imparting water-repellency to the surface of the substrate by supplying a water-repellent agent prior to a drying processing, has recently been suggested (see, e.g., Japanese Patent Laid-Open Publication No. 2012-222329). According to the technique, since the front surface of the substrate is imparted with water-repellency, the surface tension hardly acts on the pattern of the surface of the substrate. Therefore, the pattern collapse may be suppressed.

SUMMARY

A substrate processing method according to an aspect of the exemplary embodiment includes a first surface cleaning step, a second surface cleaning step, a water removal step, a water-repellency step, and a drying step. The first surface cleaning step supplies a first cleaning liquid containing water to a first surface of a substrate. The second surface cleaning step supplies a second cleaning liquid containing water to a second surface that is opposite to the first surface. The water removal step removes the water remaining on the second surface of the substrate in a state where the first surface is not exposed to outside air, after the second surface cleaning step. The water-repellency step supplies a water-repellent agent to the first surface of the substrate after the water removal step. The drying step of drying the substrate after the water-repellency step.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
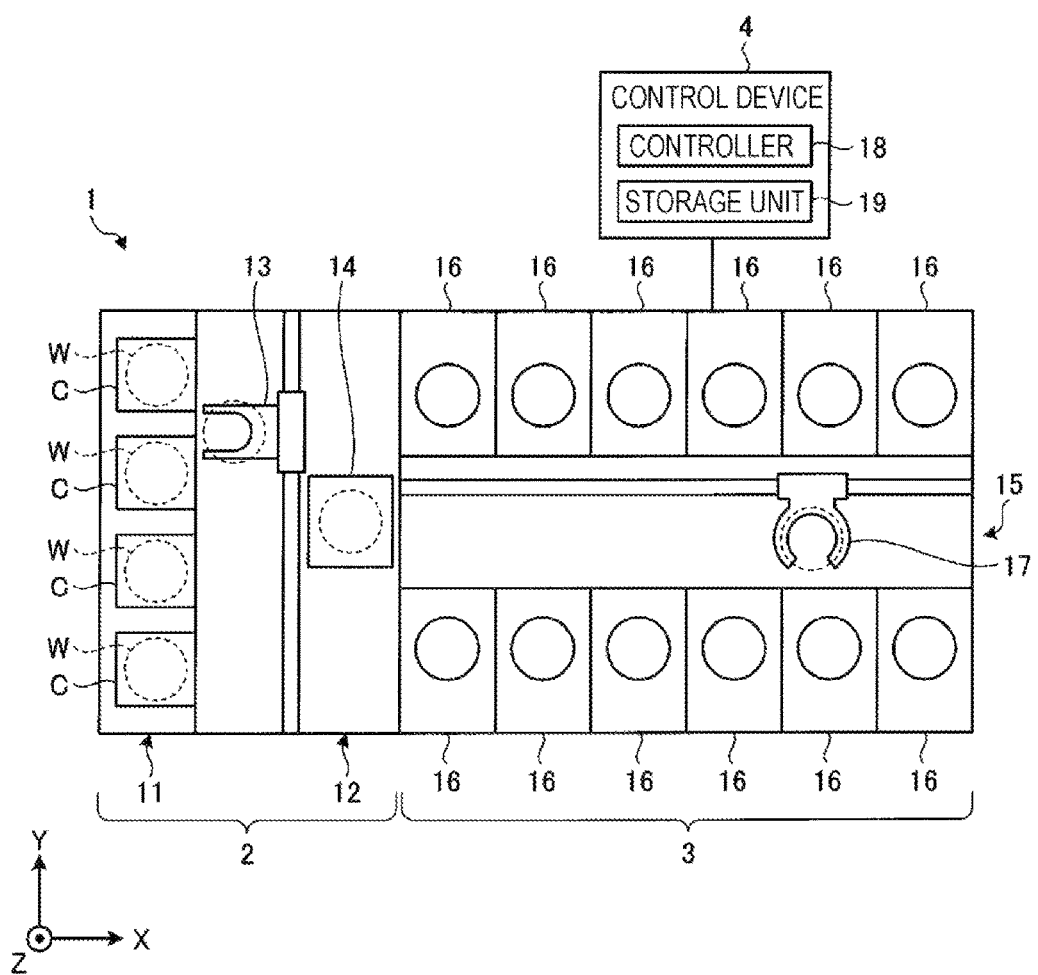
FIG. 1 is a view illustrating a schematic configuration of a substrate processing system according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the above-described conventional technique, when water is present on the rear surface of the substrate in the water-repellent processing, the atmosphere of the water-repellent agent may flow around to the rear surface of the substrate and act with the water, thereby causing a stain on the rear surface of the substrate.

In an aspect of the exemplary embodiment, an object is to provide a substrate processing method and a substrate processing apparatus capable of providing a substrate having no strain on the rear surface thereof.

A substrate processing method according to an aspect of the exemplary embodiment includes a first surface cleaning step, a second surface cleaning step, a water removal step, a water-repellency step, and a drying step. The first surface cleaning step supplies a first cleaning liquid containing water to a first surface of a substrate. The second surface cleaning step supplies a second cleaning liquid containing water to a second surface that is opposite to the first surface. The water removal step removes the water remaining on the second surface of the substrate in a state where the first surface is not exposed to outside air, after the second surface cleaning step. The water-repellency step supplies a water-repellent agent to the first surface of the substrate after the water removal step. The drying step of drying the substrate after the water-repellency step.

The above-described substrate processing method further includes a substitution step of supplying an organic solvent to the first surface of the substrate to substitute the first cleaning liquid on the first surface with the organic solvent, when performing the water removal step.

In the above-described substrate processing method, in the water removal step, a gas is supplied to the second surface of the substrate while the organic solvent is supplied to the first surface of the substrate by the substitution step.

In the above-described substrate processing method, the first cleaning liquid is supplied to the first surface of the substrate when performing the water removal step.

In the above-described substrate processing method, in the water removal step, a gas is supplied to the second surface of the substrate while the first cleaning liquid is supplied to the first surface of the substrate.

A substrate processing method according to another aspect of the exemplary embodiment includes a cleaning step of supplying a cleaning liquid containing water to at least a first surface of a substrate; a water-repellency step of supplying a water-repellent agent to the first surface of the substrate in a state where the cleaning liquid is present on a second surface that is opposite to the first surface, after the cleaning step; a drying step of drying the substrate after the water-repellency step; and a removal liquid supply step of supplying a removal liquid to the second surface to remove a stain generated on the substrate by the action of the water-repellent agent and the water, during the water-repellency step or between the water-repellency step and the drying step.

The above-described substrate processing method further includes a substitution step of supplying an organic solvent to the first surface of the substrate to substitute the water-repellent agent on the first surface with the organic solvent, when performing the removal liquid supply step.

In the above-described substrate processing method, the removal liquid is deionized water.

In the above-described substrate processing method, the removal liquid is an organic solvent.

In the above-described substrate processing method, in the substitution step, the organic solvent is supplied to the first surface of the substrate while rotating the substrate at a first rotation speed, and, in the removal liquid supply step, the rotation speed of the substrate is changed to a second rotation speed lower than the first rotation speed, so that the organic solvent supplied to the first surface flows around to the second surface as the removal liquid.

A substrate processing apparatus according to still another aspect of the exemplary embodiment includes a first surface cleaning unit configured to supply a first cleaning liquid containing water to a first surface of a substrate; a second surface cleaning unit configured to supply a second cleaning liquid containing water to a second surface that is opposite to the first surface; a water-repellent supply unit configured to supply a water-repellent agent to the first surface of the substrate; and a controller configured to perform a first surface cleaning processing of supplying the first cleaning liquid to the first surface of the substrate from the first surface cleaning unit, perform a second surface cleaning processing of supplying the second cleaning liquid to the second surface from the second surface cleaning unit, perform a water removal processing of removing the water remaining on the second surface of the substrate in a state where the first surface is not exposed to outside air, after the second surface cleaning processing, perform a water-repellency processing of supplying the water-repellent agent to the first surface of the substrate after the water removal processing from the water-repellent supply unit; and perform a drying processing of drying the substrate after the water-repellency processing.

A substrate processing apparatus according to yet another aspect to the exemplary embodiment includes a cleaning liquid supply unit configured to supply a cleaning liquid containing water to at least a first surface of a substrate; a water-repellent agent supply unit configured to supply a water-repellent agent to the first surface of the substrate; a removal liquid supply unit configured to supply a removal liquid that removes stains generated on the substrate by the action of the water-repellent agent and the water; and a controller configured to perform a cleaning processing of supplying the cleaning liquid to at least the first surface of a substrate from the cleaning liquid supply unit, perform a water-repellency processing of supplying the water-repellent agent to the substrate in a state where the cleaning liquid is present on a second surface that is opposite to the first surface from the water-repellent supply unit, after the cleaning processing, perform a drying processing of drying the substrate after the water-repellency processing; and perform a removal liquid supply processing of supplying the removal liquid to the second surface from the removal liquid supply unit, during the water-repellency processing or between the water-repellency processing and the drying processing.

According to an aspect to the exemplary embodiment, it is possible to provide a substrate having no strain on the rear surface thereof.

First Exemplary Embodiment

<Configuration of Substrate Processing System>

FIG. 1 is a view illustrating a schematic configuration of a substrate processing system according to an exemplary embodiment of the present disclosure. In the following, in order to clarify positional relationships, the X-axis, the Y-axis, and the Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C are placed to accommodate a plurality of substrates, i.e., semiconductor wafers (hereinafter, "wafers W") in the present exemplary embodiment, horizontally.

The transfer section 12 is provided adjacent to the carrier placing section 11, and provided with a substrate transfer device 13 and a delivery unit 14 therein. The substrate transfer device 13 is provided with a wafer holding mechanism configured to hold a wafer W. Further, the substrate transfer device 13 is movable horizontally and vertically and pivotable around a vertical axis. The substrate transfer device 13 transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 are arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a controller 18 and a storage unit 19. The storage unit 19 stores a program that controls various processings performed in the liquid processing system 1. The controller 18 controls the operations of the liquid processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then, places the taken wafer W on the transfer unit 14. The wafer W placed on the transfer unit 14 is taken out from the transfer unit 14 by the substrate transfer device 17 of the processing station 3, and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

The processing unit 16 according to the first exemplary embodiment processes the wafer W with various processing liquids, supplies a water-repellent agent to the wafer W to impart water-repellency to the front surface of the wafer W, and then, dries the wafer W. Since the front surface of the wafer W is imparted with water-repellency, the processing liquids remaining on the wafer W are dried while maintaining the contact angle with the pattern at about 90°. Thus, the surface tension acting on the pattern is reduced. As a result, the pattern collapse may be suppressed.

Here, when water is present on the rear surface of the wafer W during the water-repellency processing, the atmosphere of the water-repellent agent may flow around to the rear surface of the wafer W and act with the water, thereby generating a stain on the rear surface of the wafer W.

Figure 2:
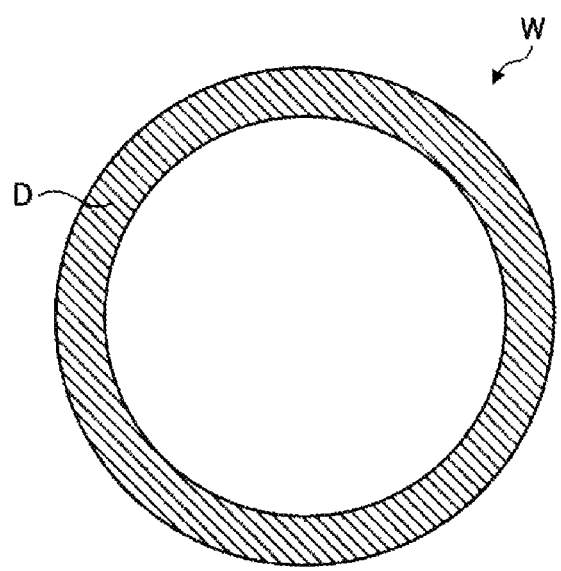
FIG. 2 is a schematic view of a stain generated on a rear surface of a wafer.

FIG. 2 is a schematic view of a stain generated on the rear surface of the wafer W. As illustrated in FIG. 2, the present inventors have found that the stain D is generated in an outer peripheral portion of the rear surface of the wafer W. Further, the stain D is an organic-based stain, and is tinged with white.

The stain D may contaminate the apparatus by, for example, image-transfer. Therefore, in the substrate processing system 1 according to the first exemplary embodiment, a step of removing water remaining on the rear surface of the wafer W is performed prior to the water-repellency processing, in order to suppress the generation of the stain D. Hereinafter, detailed descriptions will be made in this regard.

<Configuration of Processing Unit>

Figure 3:
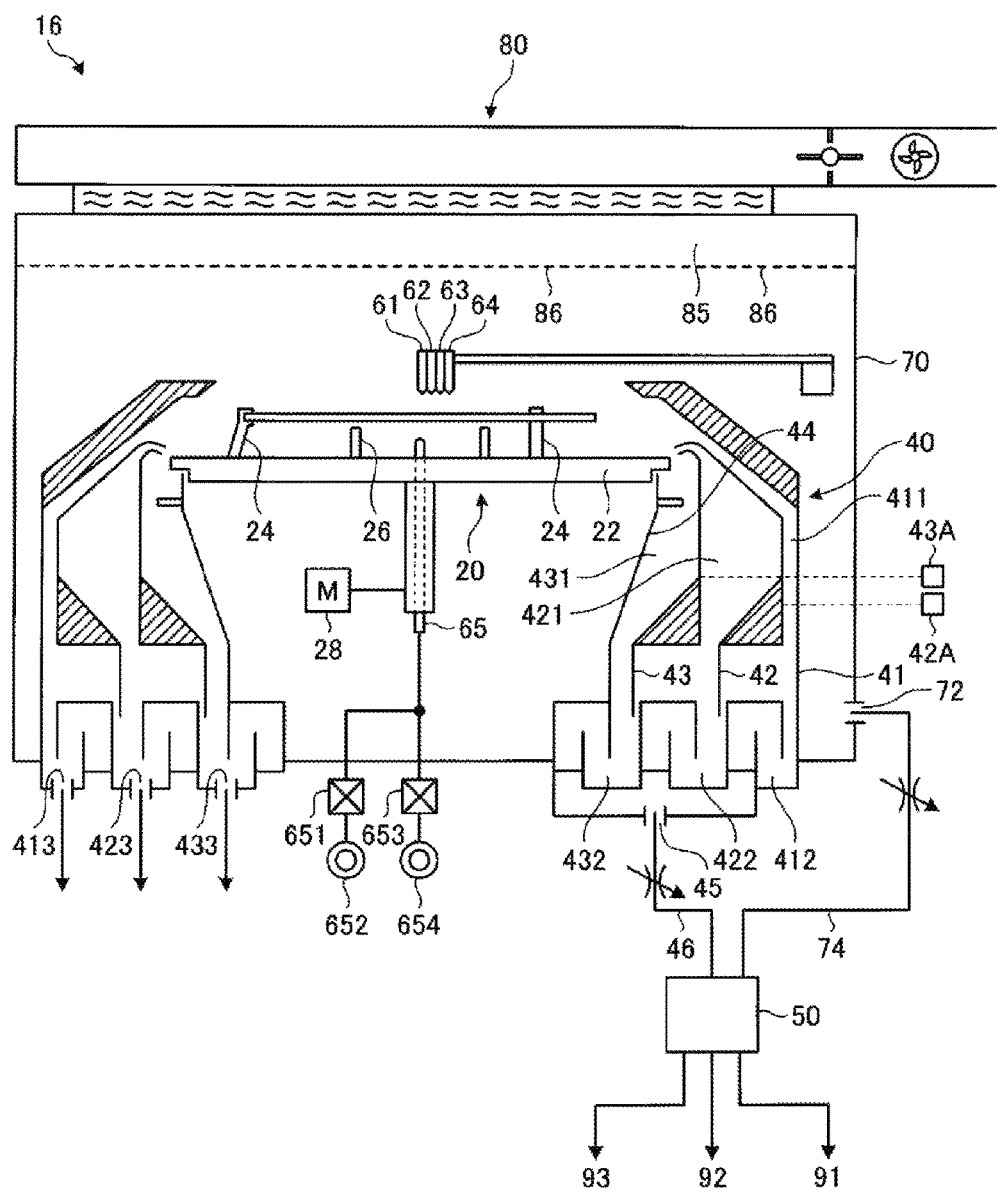
FIG. 3 is a view illustrating an exemplary configuration of a processing unit according to a first exemplary embodiment.

First, descriptions will be made on an exemplary configuration of the processing unit 16 with reference to FIG. 3. FIG. 3 is a view illustrating an exemplary configuration of the processing unit 16 according to the first exemplary embodiment.

As illustrated in FIG. 3, the processing unit 16 includes a substrate holding unit 20 that holds a wafer W in a horizontal posture. The substrate holding unit 20 includes a disc-shaped base 22 and a plurality of (e.g., three (3)) chuck claws 24 attached to the base 22, and is configured as a mechanical spin chuck to hold a plurality of locations of the peripheral portion of the wafer W by the chuck claws 24. The base 22 has a plate (not illustrated) incorporated therein. The plate has lift pins 26 that support and lift up the rear surface of the wafer W when the wafer W is delivered from/to the substrate transfer device 17. The substrate holding unit 20 may be rotated by a rotation driving unit 28 having an electric motor, which may rotate the wafer W held by the substrate holding unit 20, around a vertical axis.

A cup 40 includes a first immovable annular cup 41 positioned outermost (i.e., an outer cup), a second liftable annular cup 42 positioned inside the first cup 41, a third liftable annular cup 43 positioned inside the second cup 42, and an immovable inner wall 44 positioned inside the third cup 43. The second cup 42 and the third cup 43 are moved up and down by lifting mechanisms 42A, 42B, respectively, which are schematically illustrated in FIG. 3. The first to third cups 41 to 43 and the inner wall 44 are not rotated. A first flow path 411 is formed between the first cup 41 and the second cup 42. A second flow path 421 is formed between the second cup 42 and the third cup 43. A third flow path 431 is formed between the third cup 43 and the inner wall 44.

A cup exhaust port 45 is formed in the bottom portion of the cup 40 to communicate with the first flow path 411, the second flow path 421, and the third flow path 431. The cup exhaust port 45 is connected with a cup exhaust path 46.

A bent portion is provided in the middle of each of the first flow path 411, the second flow path 421, and the third flow path 431, and the direction of the bent portion is abruptly changed, so that a liquid component is separated from a gas-liquid mixed fluid flowing through each flow path. The separated liquid falls into a liquid receiver 412 corresponding to the first flow path 411, a liquid receiver 422 corresponding to the second flow path 421, and a liquid receiver 432 corresponding to the third flow path 431. Drain ports 413, 423, 433 are formed in the bottom portions of the liquid receivers 412, 422, 432, respectively.

The processing unit 16 further includes a plurality of processing liquid nozzles that supply a processing liquid toward the wafer W which is held by the substrate holding unit 20 and rotates. In this example, a first nozzle 61 that supplies a chemical liquid (e.g., dilute hydrofluoric acid (DHF)), a second nozzle 62 that supplies deionized water (DIW) serving as a rinse liquid, a third nozzle 63 that supplies isopropyl alcohol (IPA) which is a volatile organic solvent, and a fourth nozzle 64 that supplies a water-repellent agent, are provided. Each of the nozzles 61 to 64 is supplied with a processing liquid from a processing liquid supply mechanism (not illustrated) which is connected to a processing liquid source and provided with a processing liquid supply path to which an opening/closing valve and a flow rate adjustor (e.g., a flow rate adjusting valve) are interposed.

Here, the water-repellent agent is obtained by diluting, for example, a water-repellent agent for imparting water-repellency to the front surface of the wafer W, with a thinner to a predetermined concentration. The water-repellent agent may be a silylating agent (or a silane coupling agent). Specific examples of the water-repellent agent may include trimethylsilyldimethyl amine (TMSDMA), dimetylsilyldimethylamine (DMSDMA), trmethylsilyldiethylamine (TMSDEA), hexamethyldisilazane (HMDS), and 1,1,3,3-tetramethyldisilazane (TMDS).

Further, the thinner may be an ether-based solvent, or a ketone-based organic solvent. Specific examples of the thinner may include propylene glycol monomethyl ether acetate (PGMEA), cyclohexanone, and hydrofluloroether (HFE).

Here, descriptions will be made on a case of using DIW as the rinse liquid. However, the rinse liquid is not necessarily DIW as long as it contains water. In addition, descriptions will be made here on a case of using IPA as the organic solvent. However, the organic solvent is not limited to IPA, as long as it has an affinity for both of water and the water-repellent agent.

Further, here, the processing unit 16 includes the first nozzle 61 for the chemical liquid, the second nozzle 62 for DIW, the third nozzle 63 for IPA, and the fourth nozzle 64 for the water-repellent agent. However, the processing unit 16 may supply the chemical liquid, DIW, IPA, and the water-repellent agent from a single nozzle.

The substrate holding unit 20 and the cup 40 are accommodated in a housing 70. A fan filter unit (FFU) 80 is provided in the ceiling of the housing 70.

A rectifying plate 85 with a plurality of through-holes 86 is provided below the ceiling of the housing 70. The rectifying plate 85 rectifies clean air CA, which is ejected downward from the FFU 80, to flow intensively onto the wafer W. The housing 70 always has, formed therein, a downflow of the clean air flowing downward from the though-holes 86 of the rectifying plate 85 toward the wafer W.

A housing exhaust port 72 is provided in a lower portion of the housing 70 (specifically, at a position at least lower than the upper opening of the cup 40), which is also in an outer portion of the cup 40, to exhaust the atmosphere in the housing 70. The housing exhaust port 72 is connected with a housing exhaust path 74.

The cup exhaust path 46 and the housing exhaust path 74 are selectively connected to a first exhaust line 91, a second exhaust line 92, and a third exhaust line 93, which constitute a part of a factory exhaust system, depending on a position of a valve body of a switching valve 50. Since each of the exhaust lines 91 to 93 is under a negative pressure, the internal space of the cup 40 and the internal space of the housing 70 are sucked depending on the position of the valve body of the switching valve 50.

In addition, the processing unit 16 further includes a fifth nozzle 65. The fifth nozzle 65 is inserted through a hollow portion (not illustrated) formed in the central portion of the base 22, and supplies a fluid onto the rear surface of the wafer W. The fifth nozzle 65 is connected with a chemical liquid source 652 via a valve 651 and with a rinse liquid source 654 via a valve 653. The fifth nozzle 65 supplies DHF and DIW, which are supplied from the chemical liquid source 652 and the rinse liquid source 654, respectively, to the central portion of the rear surface of the wafer W.

<Specific Operation of Processing Unit>

Figure 4:
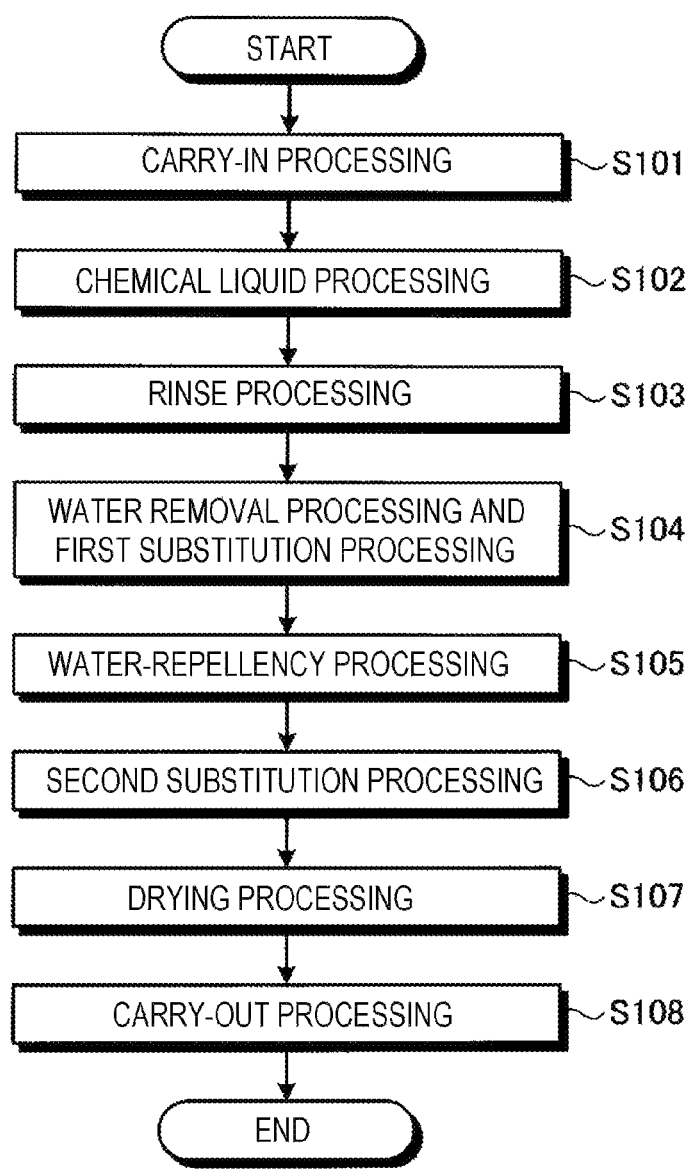
FIG. 4 is a flowchart illustrating a processing procedure of a substrate cleaning processing performed by a processing unit.
Figure 5A:
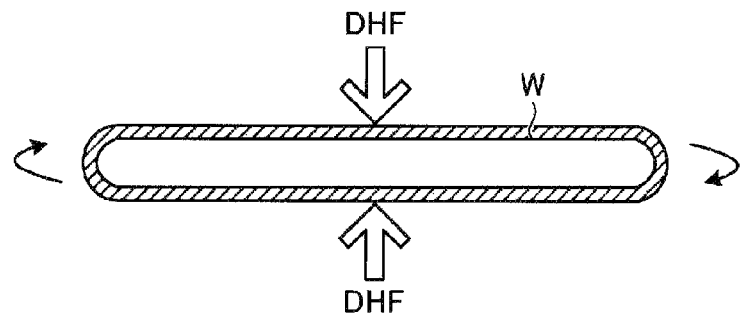
FIG. 5A is an explanatory view of a chemical liquid processing.
Figure 5B:
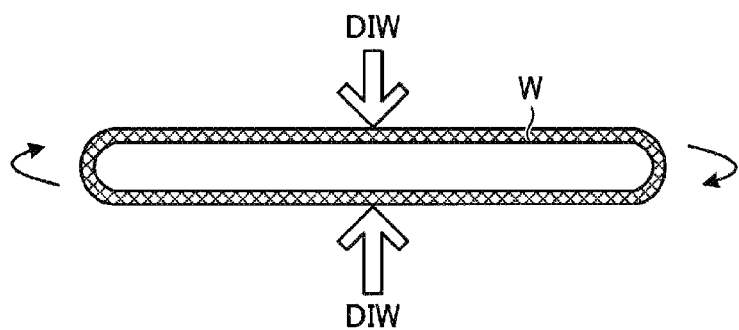
FIG. 5B is an explanatory view of a rinse processing.
Figure 5C:
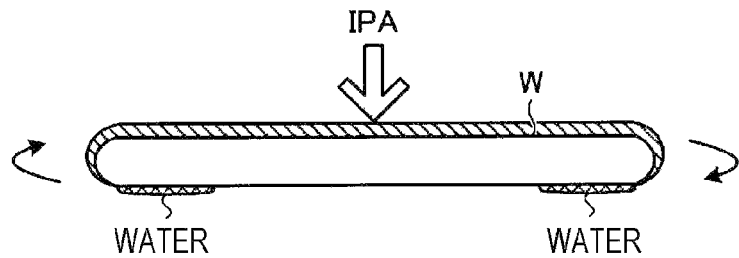
FIG. 5C is an explanatory view of a first substitution processing.
Figure 5D:
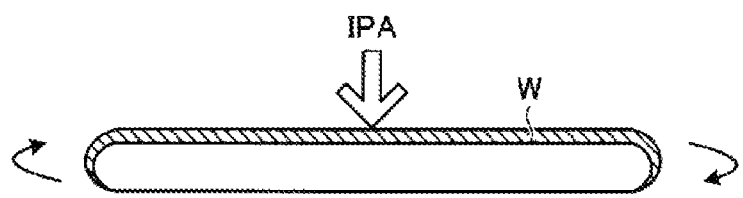
FIG. 5D is an explanatory view of a water removal processing.
Figure 5E:
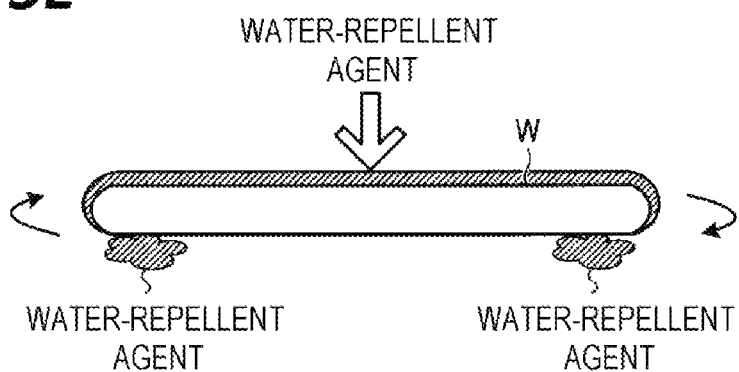
FIG. 5E is an explanatory view of a water-repellency processing.
Figure 5F:
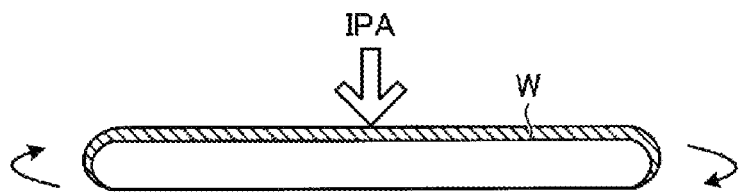
FIG. 5F is an explanatory view of a second substitution processing.

Next, descriptions will be made on the contents of a substrate cleaning processing performed by the processing unit 16 with reference to FIG. 4 and FIGS. 5A to 5F. FIG. 4 is a flowchart illustrating a processing procedure of a substrate cleaning processing performed by the processing unit 16. Further, FIG. 5A is an explanatory view of a chemical liquid processing, FIG. 5B is an explanatory view of a rinse processing, FIG. 5C is an explanatory view of a first substitution processing, FIG. 5D is an explanatory view of a water removal processing, FIG. 5E is an explanatory view of a water-repellency processing, and FIG. 5F is an explanatory view of a second substitution processing.

Further, the processing procedure of the substrate cleaning processing illustrated in FIG. 4 is executed by reading a program stored in the storage unit 19 of the control device 4 by the control unit 18 and controlling the processing unit 16 based on the read instruction.

As illustrated in FIG. 4, the substrate transfer device 17 (see, e.g., FIG. 1) carries the wafer W into the housing 70 of the processing unit 16 (step S101). The wafer W is held by the chuck claws 24 (see, e.g., FIG. 3) in a state where the pattern forming surface faces upward. Thereafter, the controller 18 rotates the substrate holding unit 20 at a predetermined rotation speed.

Subsequently, the processing unit 16 performs a chemical liquid processing (step S102). Specifically, the processing unit 16 ejects DHF serving as the chemical liquid from the first nozzle 61 toward the front surface of the rotating wafer W for a predetermined period of time, and simultaneously, ejects DHF serving as the chemical liquid from the fifth nozzle 65 toward the rear surface of the rotating wafer W for a predetermined period of time. The supply time of the DHF in the first nozzle 61 is the same as that in the fifth nozzle 65. The DHF supplied to the front and rear surfaces of the wafer W is spread entirely over both surfaces of the wafer W by a centrifugal force attended by the rotation of the wafer W. Therefore, the front and rear surfaces of the wafer W are cleaned (see, e.g., FIG. 5A).

In the chemical processing, the second cup 42 and the third cup 43 are positioned at a descending position, and the DHF serving as the chemical liquid flows through the first flow path between the first cup 41 and the second cup 42. Further, the clean air present in the space over the wafer W flows through the first flow path 411 to be exhausted from the cup exhaust port 45, and flows to the first exhaust line 91 through the cup exhaust path 46 and the switching valve 50.

Subsequently, the processing unit 16 performs a rinse processing (step S103). Specifically, the processing unit 16 ejects DIW serving as the rinse liquid from the second nozzle 62 toward the front surface of the rotating wafer W for a predetermined period of time, and simultaneously, ejects DIW serving as the rinse liquid from the fifth nozzle 65 toward the rear surface of the rotating wafer W for a predetermined period of time. The supply time of the DIW in the second nozzle 62 is the same as that in the fifth nozzle 65. The DIW supplied to the front and rear surfaces of the wafer W is spread entirely over both surfaces of the wafer W by a centrifugal force attended by the rotation of the wafer W. Thus, the DHF remaining on the front and rear surfaces of the wafer W is washed out with the DIW (see, e.g., FIG. 5B).

In the rinse processing, the second cup 42 is positioned at an ascending position, and the third cup 43 is positioned at a descending position, so that the DIW serving as the rinse liquid flows through the second flow path 421, falls into the liquid receiver 422, and is discharged from the cup 40 through the drain port 423. Further, the gas (clean air) present in the space over the wafer W flows into the cup 40 through the upper opening of the first cup 41, flows through the second flow path 421 between the second cup 42 and the third cup 43 to be exhausted from the cup exhaust port 45, and flows to the second exhaust line 92 through the cup exhaust path 46 and the switching valve 50. The gas present in the space around the cup 40 in the internal space of the housing 70 is exhausted from the housing exhaust port 72, and flows to the second exhaust line 92 through the housing exhaust path 74 and the switching valve 50.

As described above, in the processing unit 16, DHF is supplied to both surfaces of the wafer W in the chemical liquid processing. Accordingly, in the processing unit 16, DIW is supplied to both surfaces of the wafer W in the rinse processing to wash out the DHF remaining on both surfaces of the wafer W. Therefore, in the processing unit 16, since DIW is supplied to the rear surface of the wafer W, water easily remains on the rear surface of the wafer W. The water supplied to the rear surface of the wafer W is concentrated in the outer peripheral portion of the rear surface of the wafer W by a centrifugal force attended by the rotation of the wafer W. Thus, the water easily remains in the outer peripheral portion of the rear surface of the wafer W.

The rinse processing corresponds to an example of the first surface cleaning step of supplying a first cleaning liquid containing water to a first surface of a substrate, and the second surface cleaning step of supplying a second cleaning liquid to a second surface that is opposite to the first surface.

Subsequently, the processing unit 16 performs a water removal processing, and a first substitution processing on the front surface of the wafer W (step S104). Specifically, as the water removal processing, the processing unit 16 rotates the wafer W in a state where the front surface of the wafer W is not exposed to outside air until the water-repellency processing (step S104) is started after the rinse processing (step S103) is completed, thereby removing the DIW remaining in the outer peripheral portion of the rear surface of the wafer W by a centrifugal force attended by the rotation of the wafer W.

Therefore, the water remaining in the outer peripheral portion of the rear surface of the wafer W may be removed before the water-repellency processing is started. Thus, even though the atmosphere of the water-repellent agent flows around to the rear surface of the wafer W in the water-repellency processing (to be described later), the generation of the stain D may be suppressed.

Further, as the first substitution processing, the processing unit 16 ejects IPA from the third nozzle 63 to the front surface of the rotating wafer W for a predetermined period of time until the water-repellency processing (step S104) is started after the rinse processing (step S103) is completed. The IPA supplied to the front surface of the wafer W is spread over the entire front surface of the wafer W by a centrifugal force attended by the rotation of the wafer W. Thus, the DIW remaining on the front surface of the wafer W is substituted with the IPA having affinity for the water-repellent agent ejected to the wafer W in the subsequent water-repellency processing. Further, since the IPA also has affinity for the DIW, the substitution of DIW with IPA is also facilitated.

In this way, the processing unit 16 supplies IPA serving as the organic solvent to the front surface of the wafer W when performing the water removal processing, thereby performing a substitution processing of substituting the DIW on the front surface of the wafer W with IPA. Thus, according to the processing unit 16, since a liquid film is formed on the entire front surface of the wafer W by IPA, or a mixture of IPA and DIW during the water removal processing, the front surface of the wafer W may be suppressed from being exposed (see, e.g., FIGS. 5C and 5D).

When the state where the front surface of the wafer W is exposed, in other words, the state where the processing liquid is not supplied to the front surface of the wafer W continues, pattern collapse may occur by the action of the surface tension of the DIW on the pattern formed on the front surface of the wafer W. Therefore, according to the processing unit 16, the pattern collapse during the water removal processing may be suppressed by preventing the front surface of the wafer W from being exposed during the water removal processing.

Subsequently, the processing unit 16 performs a water-repellent processing (step S105). Specifically, the processing unit 16 ejects a silylating agent serving as the water-repellent agent from the fourth nozzle 64 to the front surface of the rotating wafer W for a predetermined period of time. The water-repellent agent supplied to the front surface of the wafer W is spread over the entire front surface of the wafer W by a centrifugal force attended by the rotation of the wafer W. Accordingly, silyl groups are bonded to OH groups of the front surface of the wafer W, so that a water-repellent film is formed on the front surface of the wafer W.

As illustrated in FIG. 5E, the water remaining in the outer peripheral portion of the rear surface of the wafer W is removed before the water-repellency processing is started. Thus, even though the atmosphere of the water-repellent agent flows around to the rear surface of the wafer W in the water-repellency processing, the generation of the stain D may be suppressed.

In the water-repellency processing, the second cup 42 and the third cup 43 are positioned at an ascending position, so that the water-repellent agent flows through the third flow path 431, falls into the liquid receiver 432, and is discharged from the cup 40 through the drain port 433. Further, the gas (clean air) present in the space over the wafer W flows into the cup 40 through the upper opening of the first cup 41, flows through the third flow path 431 between the third cup 43 and the inner wall 44 to be exhausted from the cup exhaust port 45, and flows to the third exhaust line 93 through the cup exhaust path 46 and the switching valve 50. The gas present in the space around the cup 40 in the internal space of the housing 70 is exhausted from the housing exhaust port 72, and flows to the third exhaust line 93 through the housing exhaust path 74 and the switching valve 50.

Subsequently, the processing unit 16 performs a second substitution processing (step S106). The second substitution processing is performed in the same procedure as in the first substitution processing. Owing to the second substitution processing, the water-repellent agent remaining on the front surface of the wafer W is substituted with the IPA (see, e.g., FIG. 5F).

Subsequently, the processing unit 16 performs a drying processing (step S107). Specifically, the processing unit 16 increases the rotation speed of the wafer W, so that the IPA remaining on the wafer W is shaken off, thereby drying the wafer W.

Thereafter, the processing unit 16 performs a carry-out processing (step S108). Specifically, the processing unit 16 stops the rotation of the wafer W, and then, carries the wafer W out of the processing unit 16 by the substrate transfer device 17 (see, e.g., FIG. 1). When the carry-out processing is completed, a series of substrate processings on one water W is completed.

As described above, the substrate processing method according to the first exemplary embodiment includes the rinse processing (corresponding to an example of the "first surface cleaning step" and the "second surface cleaning step"), the water removal processing (corresponding to an example of the "water removal step"), the water-repellency processing (corresponding to an example of the "water-repellency step"), and the drying processing (corresponding to an example of the "drying step"). In the rinse processing, DIW (corresponding to an example of the "first cleaning liquid containing water") is supplied to the front surface (corresponding to an example of the "first surface") of the wafer W, and DIW (corresponding to an example of the "second cleaning liquid containing water") is supplied to the rear surface (corresponding to an example of the "second surface") of the wafer W. After the rinse processing, in the water removal processing, the water remaining on the rear surface of the wafer W is removed. After the water removal processing, in the water-repellency processing, the water-repellent agent is supplied to the front surface of the wafer W. After the water-repellency processing, in the drying processing, the wafer W is dried.

Further, the substrate processing method according to the first exemplary embodiment performs, when performing the water removal processing, the first substitution processing (corresponding to an example of the "substitution step") in which IPA (corresponding to an example of the "organic solvent") is supplied to the front surface of the wafer W to substitute the DIW on the front surface of the wafer W with the IPA.

Further, the processing unit 16 according to the first exemplary embodiment (corresponding to an example of the "substrate processing apparatus") includes the second nozzle 62 (corresponding to an example of the "first surface cleaning unit"), the fifth nozzle 65 (corresponding to an example of the "second surface cleaning unit"), the fourth nozzle 64 (corresponding to an example of the "water-repellent agent supply unit"), and the controller 18. The second nozzle 62 supplies DIW to the front surface of the wafer W. The fifth nozzle 65 supplies DIW to the rear surface of the wafer W. The fourth nozzle 64 supplies a water-repellent agent to the front surface of the wafer W. The controller 18 performs the rinse processing (corresponding to an example of the "first surface cleaning processing" and the "second surface cleaning processing") of supplying DIW from the second nozzle 62 to the front surface of the wafer W and supplying DIW from the fifth nozzle 65 to the rear surface of the wafer W, the water removal processing of removing the water remaining on the rear surface of the wafer after the rinse processing, the water-repellency processing of supplying the water-repellent agent from the fourth nozzle 64 to the front surface of the wafer W after the water removal processing, and the drying processing of drying the wafer W after the water-repellency processing.

Therefore, the water remaining in the outer peripheral portion of the rear surface of the wafer W may be removed before the water-repellency processing is started. Accordingly, it is possible to suppress the pattern collapse of the wafer W, as well as to provide a wafer W having no stain D in the outer peripheral portion of the rear surface.

Here, descriptions have been made on the case where the chemical liquid is supplied to both surfaces of the wafer W in the chemical liquid processing, and the rinse liquid is supplied to both surfaces of the wafer W in the rinse processing. However, without being limited thereto, the processing unit 16 may supply the chemical liquid only to the front surface of the wafer W in the chemical liquid processing, and supply the rinse liquid to both surfaces of the wafer W in the rinse processing.

Second Exemplary Embodiment

Figure 6:
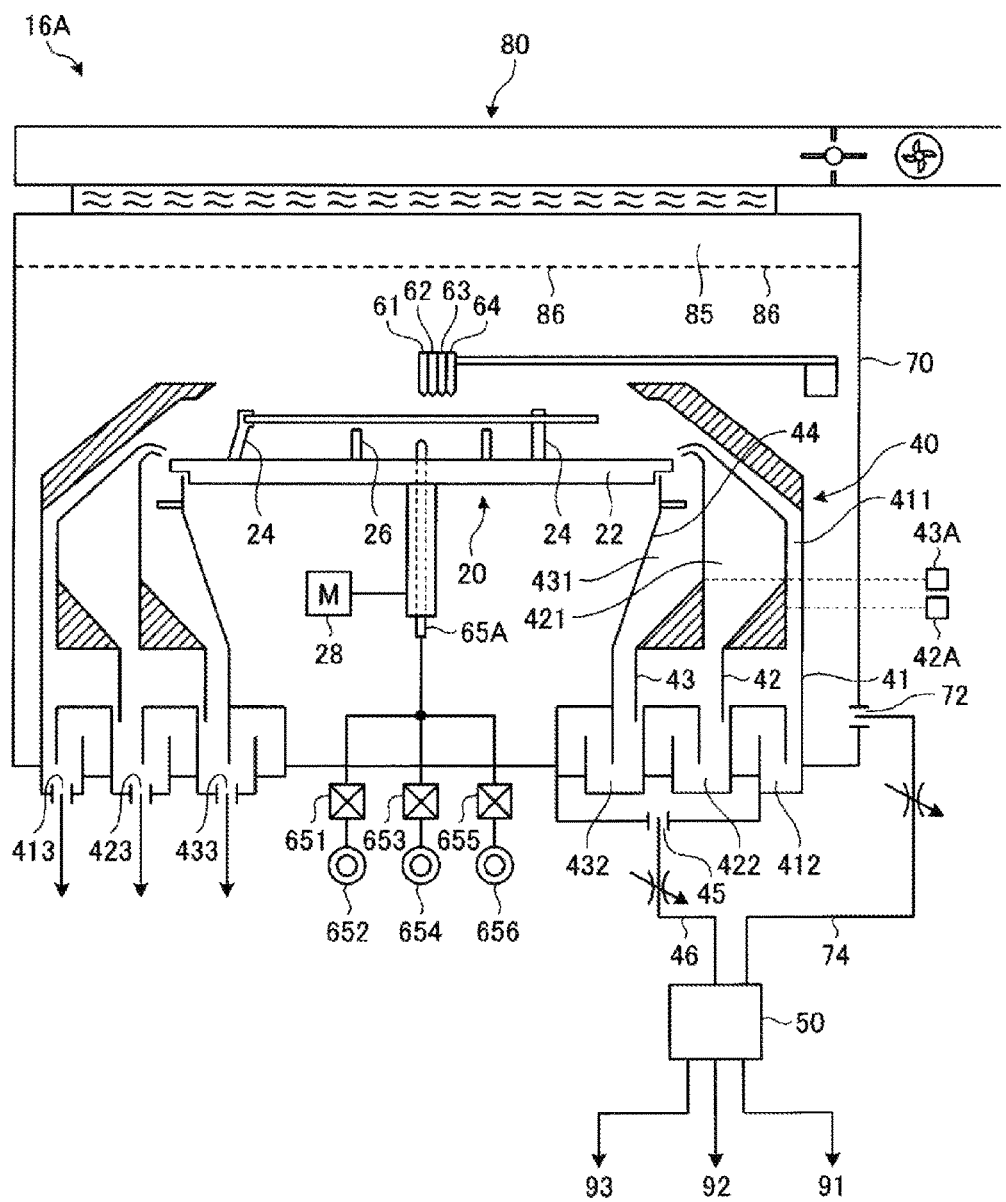
FIG. 6 is a view illustrating an exemplary configuration of a processing unit according to a second exemplary embodiment.

Next, a substrate processing system according to a second exemplary embodiment will be described. FIG. 6 is a view illustrating an exemplary configuration of a processing unit according to a second exemplary embodiment. In the following descriptions, portions identical to the already described portions will be denoted by the same reference numerals, and overlapping descriptions thereof will be omitted.

As illustrated in FIG. 6, a processing unit 16A according to the second exemplary embodiment includes a fifth nozzle 65A. The fifth nozzle 65A is connected with a gas source 656 via a valve 655, in addition to being connected with the chemical liquid source 652 and the rinse liquid source 654. The fifth nozzle 65A supplies a gas, which is supplied from the gas liquid source 656, to the central portion of the rear surface of the wafer W. Here, the gas supplied from the fifth nozzle 65A is $N_2$. However, the gas supplied from the fifth nozzle 65A may be any gas other than $N_2$ (e.g., argon gas).

Figure 7:
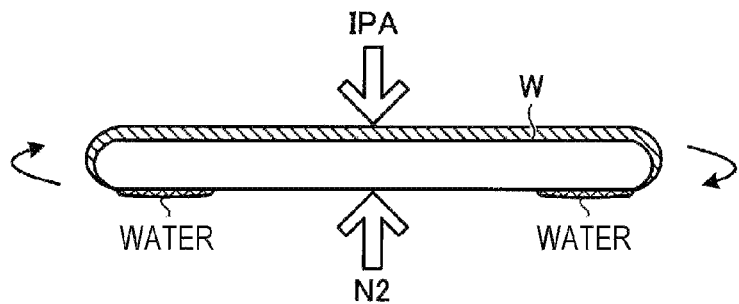
FIG. 7 is an explanatory view of a water removal processing according to the second exemplary embodiment.

Next, descriptions will be made on the contents of a water removal processing performed by the processing unit 16A with reference to FIG. 7. FIG. 7 is an explanatory view of a water removal processing according to the second exemplary embodiment. Similarly to the water removal processing according to the first exemplary embodiment, the water removal processing according to the second exemplary embodiment is performed after a rinse processing and before a water-repellency processing.

As illustrated in FIG. 7, the processing unit 16A ejects $N_2$ from the fifth nozzle 65A toward the rear surface of the rotating wafer W for a predetermined period of time as the water removal processing, while ejecting IPA from the third nozzle 63 toward the front surface of the rotating wafer W for a predetermined period of time as the first substitution processing.

Therefore, the water remaining in the peripheral portion of the rear surface of the wafer W may be removed in a short time as compared with the water removal processing according to the first exemplary embodiment. That is, since the time required for the water removal processings may be reduced, the time required for a series of substrate processings may be reduced.

The processing unit 16A may continuously perform the processing of supplying $N_2$ to the rear surface of the wafer W even after the water removal processing. That is, when $N_2$ is supplied to the rear surface of the wafer W even during the water-repellency processing which is performed after the water removal processing, the atmosphere of the water-repellent agent hardly flows from the front surface of the wafer W to the rear surface. Thus, even if the water in the outer peripheral portion of the wafer W is not completely removed, the stain D may hardly occur.

Figure 8:
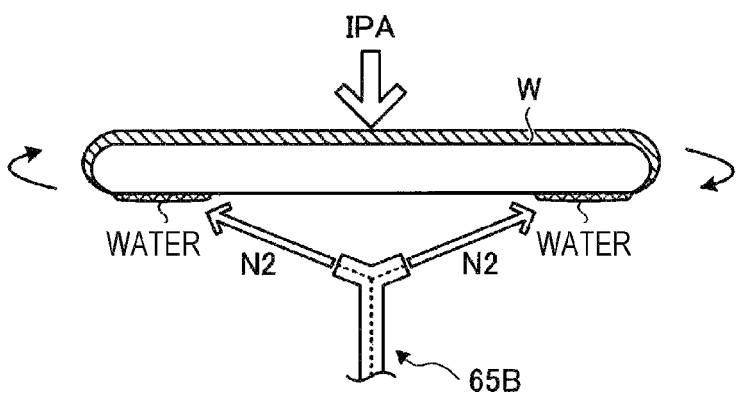
FIG. 8 is a view illustrating an exemplary configuration of a fifth nozzle according to a first modification.

Next, a modification of the fifth nozzle 65A will be described with reference to FIGS. 8 and 9. FIG. 8 is a view illustrating a configuration of a fifth nozzle according to a first modification, and FIG. 9 is a view illustrating a configuration of a fifth nozzle according to a second modification.

As illustrated in FIG. 8, a fifth nozzle 65B according to a first modification supplies $N_2$ obliquely toward the outer peripheral portion of the wafer W. With the configuration, $N_2$ may be supplied directly to the water remaining in the outer peripheral portion of the wafer W. Therefore, the water remaining in the peripheral portion of the rear surface of the wafer W may be removed in a short time as compared with the fifth nozzle 65A.

FIG. 8 illustrates a case where the fifth nozzle 65B has two ejection ports. However, the fifth nozzle 65B may include at least one ejection port.

Figure 9:
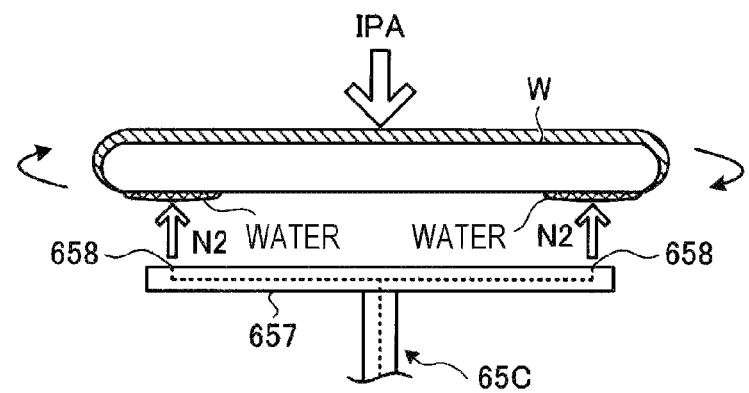
FIG. 9 is a view illustrating an exemplary configuration of a fifth nozzle according to a second modification.

Further, as illustrated in FIG. 9, a fifth nozzle 65C according to a second modification includes an ejection unit 657. The ejection unit 657 is a horizontally extending member, and has substantially the same length as the diameter of the wafer W. And, the ejection unit 657 supplies $N_2$ toward the outer peripheral portion of the wafer W from an ejection port 658 which is positioned below the outer peripheral portion of the wafer W. With the configuration, $N_2$ may be supplied directly from a position closer to the outer peripheral portion of the wafer W as compared with the fifth nozzle 65B according to the first modification. Therefore, the water remaining in the peripheral portion of the rear surface of the wafer W may be removed in a short time as compared with the fifth nozzle 65B.

As described above, the processing unit 16A according to the second exemplary embodiment supplies $N_2$ (corresponding to an example of the "gas") to the rear surface of the wafer W as the water removal processing while IPA is supplied to the front surface of the wafer W by the first substitution processing. Accordingly, since the evaporation of the water remaining in the outer peripheral portion of the rear surface of the wafer W is facilitated, the water may be removed in a short time as compared with the case of removing the water only by a centrifugal force.

Third Exemplary Embodiment

In the above-described first and second exemplary embodiments, descriptions have been made on the case of performing both the water removal processing and the first substitution processing after the rinse processing and before the water-repellency processing. However, the water removal processing may be performed after the rinse processing and before the first substitution processing.

Figure 10A:
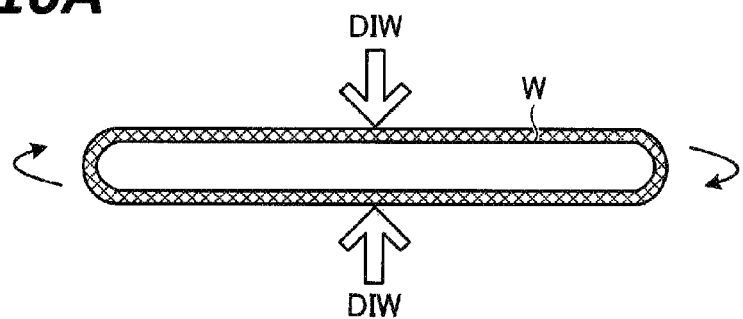
FIG. 10A is an explanatory view of a rinse processing.
Figure 10B:
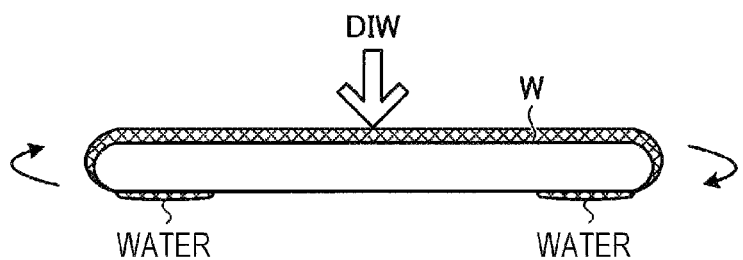
FIG. 10B is an explanatory view of a water removal processing.

Thus, in the third exemplary embodiment, descriptions will be made on a case of performing the water removal processing after the rinse processing and after the first substitution processing with reference to FIGS. 10A to 10C. FIG. 10A is an explanatory view of a rinse processing, FIG. 10B is an explanatory view of a water removal processing, and FIG. 10C is an explanatory view of a first substitution processing.

In the third exemplary embodiment, the processing unit 16 supplies a rinse liquid (DIW) to both surfaces of the wafer W in the rinse processing (see, e.g., FIG. 10A). Subsequently, after the lapse of time sufficient to wash out DHF remaining on both surfaces of the wafer W with DIW, the processing unit 16 stops the supply of the rinse liquid to the rear surface of the wafer W, and supplies the rinse liquid only to the front surface of the wafer W (see, e.g., FIG. 10B).

Figure 10C:
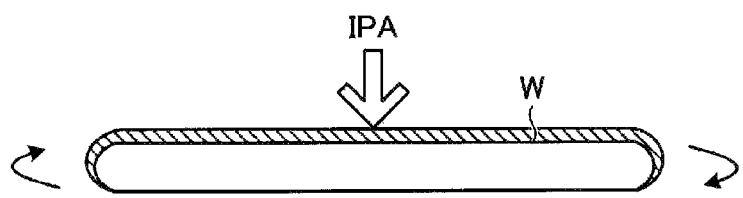
FIG. 10C is an explanatory view of a first substitution processing.

Thereafter, as illustrated in FIG. 10C, the processing unit 16 performs the first substitution processing to supply IPA to the front surface of the wafer W.

As such, in the processing unit 16 according to the third exemplary embodiment, the water remaining in the outer peripheral portion of the rear surface of the wafer W may be sufficiently removed by a centrifugal force attended by the rotation of the wafer W. Further, since the rinse liquid is supplied to the front surface of the wafer W when the water removal processing is performed, a liquid film is formed on the entire front surface of the wafer W by DIW during the water removal processing. Thus, the front surface of the wafer W may be suppressed from being exposed.

Assuming that a time until the water remaining on the rear surface of the wafer W is sufficiently removed by a centrifugal force attended by the rotation of the wafer W is T1, and a supply time of IPA in the first substitution processing is T2, a supply time of DIW to the front surface of the wafer W in the water removal processing may be set to, for example, T1-T2.

As such, here, the supply time of the rinse liquid to the front surface of the wafer W is prolonged for a predetermined period of time so as to ensure the time required to shake off the water remaining on the rear surface of the wafer W by a centrifugal force attended by the rotation of the wafer W.

Fourth Exemplary Embodiment

Figure 11:
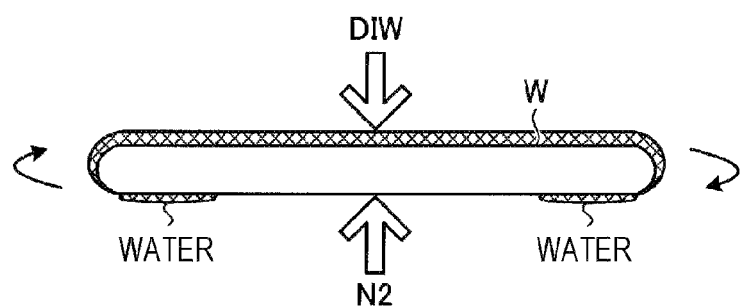
FIG. 11 is an explanatory view of a water removal processing according to a fourth exemplary embodiment.

Next, a water removal processing according to the fourth exemplary embodiment will be described with reference to FIG. 11. FIG. 11 is an explanatory view of a water removal processing according to the fourth exemplary embodiment. The water removal processing according to the fourth exemplary embodiment is performed by a processing unit including the fifth nozzles 65A to 65C capable of supplying a gas (e.g., $N_2$) to the rear surface of the wafer W (see, e.g., FIGS. 6, 8, and 9). Here, as an example, the processing is performed by the processing unit 16A including the fifth nozzle 64A (see, e.g., FIG. 6).

As illustrated in FIG. 11, the processing unit 16A ejects DIW from the second nozzle 62 toward the front surface of the rotating wafer W for a predetermined period of time, and simultaneously, ejects $N_2$ from the fifth nozzle 65A toward the rear surface of the rotating wafer W for a predetermined period of time.

As such, in the fourth exemplary embodiment, the processing unit 16A supplies a gas to the rear surface of the wafer W while supplying the rinse liquid to the front surface of the wafer W. Therefore, the water remaining in the peripheral portion of the rear surface of the wafer W may be removed in a short time as compared with the water removal processing according to the third exemplary embodiment. That is, since the time required for the water removal processing may be reduced, the time required for a series of substrate processings may be reduced.

Fifth Exemplary Embodiment

In the above-described first to fourth exemplary embodiment, descriptions have been made on the case where the generation of the stain D is suppressed in advance by removing the water remaining in the peripheral portion of the rear surface of the wafer W before the water-repellency processing.

Meanwhile, the stain D has a property of being soluble in water or an organic solvent. Thus, in the fifth exemplary embodiment, descriptions will be made on a case of removing the stain D generated in the peripheral portion of the rear surface of the wafer W by using water or an organic solvent, with reference to FIGS. 12 and 13A to 13C.

Figure 12:
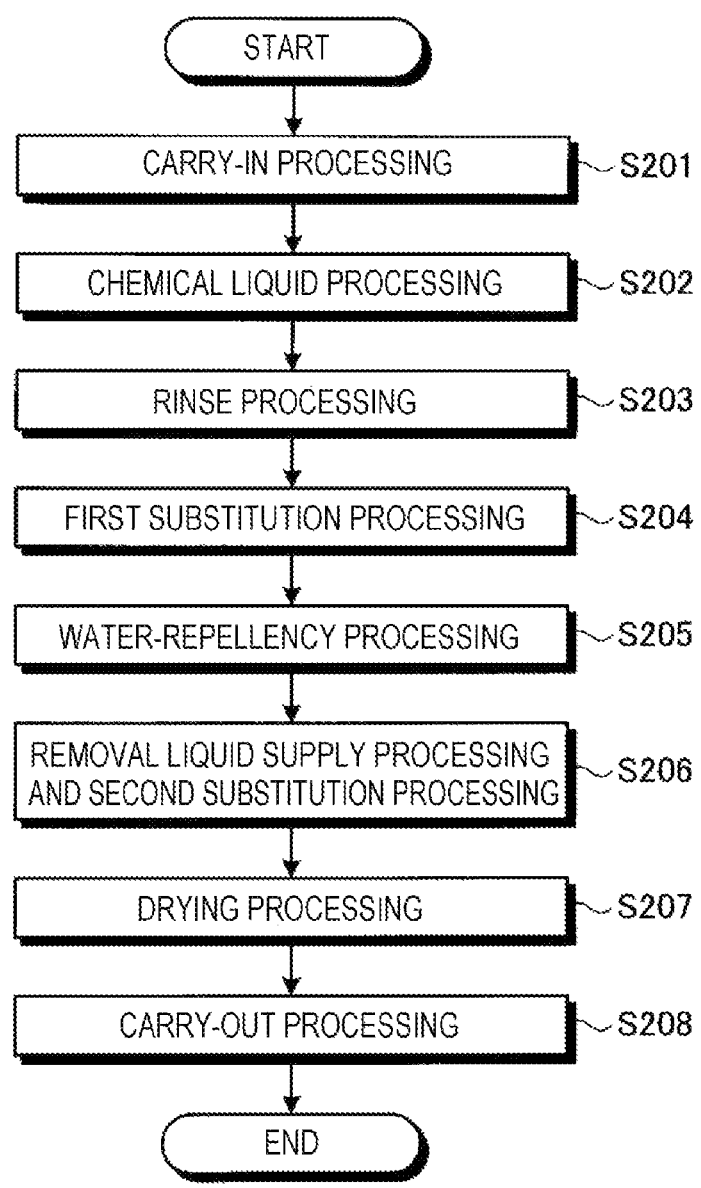
FIG. 12 is a flowchart illustrating a processing procedure of a substrate cleaning processing performed by a processing unit according to a fifth exemplary embodiment.
Figure 13A:
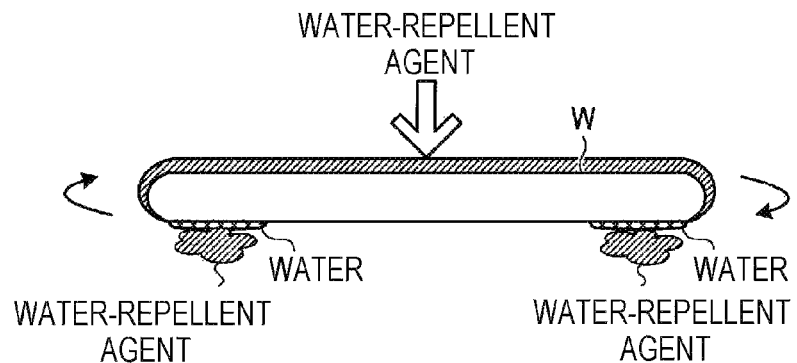
FIG. 13A is an explanatory view of a water-repellency processing.
Figure 13B:
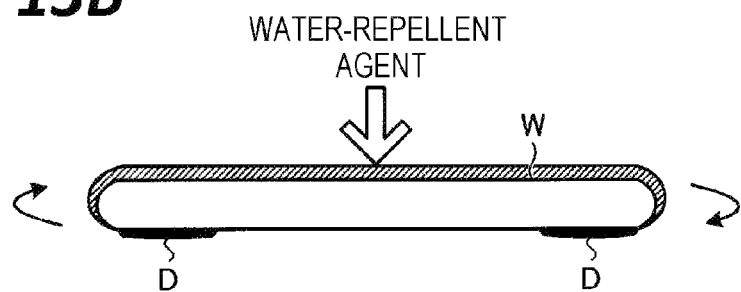
FIG. 13B is an explanatory view of a water-repellency processing.
Figure 13C:
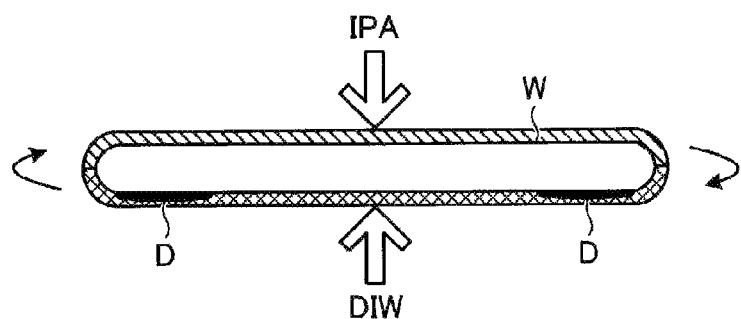
FIG. 13C is an explanatory view of a removal liquid supply processing.

FIG. 12 is a flowchart illustrating a processing procedure of a substrate cleaning processing performed by a processing unit according to the fifth exemplary embodiment. Further, FIGS. 13A and 13B are explanatory views of a water-repellent processing, and FIG. 13C is an explanatory view of a removal liquid supply processing.

Processings in steps S201 to S203 illustrated in FIG. 12 are the same as the processings in steps S101 to S103 illustrated in FIG. 4. Thus, descriptions thereof will be omitted. Further, the first substitution processing in step S204 illustrated FIG. 12 is the same as the first substitution processing in step S104 illustrated in FIG. 4. Description of the processing will also be omitted. Further, here, a series of substrate processings is performed by the processing unit 16 according to the first exemplary embodiment. However, the substrate processing may be performed by the processing unit 16A according to the second exemplary embodiment.

As illustrated in FIG. 12, in the fifth exemplary embodiment, the above-described water removal processing is not performed. Thus, in the water-repellency processing illustrated in step S205, the water remains in the outer peripheral portion of the rear surface of the wafer W. Hence, when the atmosphere of the water-repellent agent comes in contact with the water (see, e.g., FIG. 13A), a stain D is generated in the outer peripheral portion of the rear surface of the wafer W (see, e.g., FIG. 13B).

Subsequently, the processing unit 16 performs a removal liquid supply processing and a second substitution processing (step S206). Specifically, the processing unit 16 supplies DIW from the fifth nozzle 65 to the rear surface of the rotating wafer W as the removal liquid supply processing (see, e.g., FIG. 13C). The DIW supplied to the rear surface of the wafer W is spread over both the entire rear surface of the wafer W by a centrifugal force attended by the rotation of the wafer W. Therefore, the DIW is supplied to the stain D generated in the outer peripheral portion of the rear surface of the wafer W, so that the stain D is removed. Further, the processing unit 16 supplies IPA from the third nozzle 63 to the front surface of the rotating wafer W for a predetermined period of time as the second substitution processing (see, e.g., FIG. 13C). Thus, the water-repellent agent remaining on the front surface of the wafer W is substituted with the IPA. Further, the front surface of the wafer W is suppressed from being exposed during the removal liquid supply processing.

Thereafter, the processing unit 16 performs a drying processing (step S207) and a carry-out processing (step S208), and completes a series of substrate processings.

Here, as for the removal liquid supply processing, descriptions have been made on the case of supplying DIW to the rear surface of the wafer W. However, the processing unit 16 may supply, for example, IPA, in place of DIW, to the rear surface of the wafer W. In this case, the fifth nozzle 65 of the processing unit 16 may be connected to the IPA source via a valve.

Further, descriptions have been made here on the case where the removal liquid supply processing is performed during the second substitution processing. However, the removal liquid supply processing does not need to be performed during the second substitution processing. For example, the removal liquid supply processing may be performed after the water-repellent processing and before the second substitution processing, or after the second substitution processing. In this case, the removal liquid supply processing may be configured to supply DIW or IPA to the rear surface of the wafer W and supply DIW or IPA to the front surface of the wafer W at the same time.

Further, the removal liquid supply processing may be performed during the water-repellency processing. That is, the processing unit 16 may eject the water-repellent agent from the fourth nozzle 64 to the front surface of the rotating wafer W for a predetermined period of time, and eject DIW or IPA from the fifth nozzle 65 to the rear surface of the rotating wafer W. The stain D is generated when some water is present on the rear surface of the wafer W. Thus, the generation of the stain D may be suppressed by continuously supplying a large amount of DIW or IPA to the rear surface of the wafer W during the water-repellency processing. Even if a stain D is generated, the stain D may be removed by the DIW or IPA.

As described above, the substrate processing method according to the fifth exemplary embodiment includes the rinse processing (corresponding to an example of the "cleaning step"), the water-repellency processing (corresponding to an example of the "water-repellency step"), the drying processing (corresponding to an example of the "drying step"), and the removal liquid supply processing (corresponding to an example of the "removal liquid supply processing"). In the rinse processing, the rinse liquid containing water is supplied to at least the front surface of the wafer W. After the rinse processing, in the water-repellency processing, the water-repellent agent is supplied to the front surface (corresponding to an example of the "first surface") of the wafer W. After the water-repellency processing, in the drying processing, the wafer W is dried. In the removal liquid supply processing, DIW (corresponding to an example of the "removal liquid") is supplied to the rear surface (corresponding to an example of the "second surface") of the wafer W during the water-repellency processing or between the water-repellency processing and the drying processing to remove the stain D generated in the outer peripheral portion of the wafer W by the action of the water-repellent agent and the water.

Further, the substrate processing method according to the fifth exemplary embodiment performs, when performing the removal liquid supply processing, the second substitution processing (corresponding to an example of the "substitution step") in which IPA (corresponding to an example of the "organic solvent") is supplied to the front surface of the wafer W to substitute the water-repellent agent on the front surface of the wafer W with the IPA.

Further, the processing unit 16 according to the fifth exemplary embodiment (corresponding to an example of the "substrate processing apparatus") includes the second nozzle 62 and the fifth nozzle 65 (corresponding to an example of the "cleaning liquid supply unit"), the fourth nozzle 64 (corresponding to an example of the "water-repellent agent supply unit"), the fifth nozzle 65 (corresponding to an example of the "removal liquid supply unit"), and the controller 18. The second nozzle 62 and the fifth nozzle 65 supply the rinse liquid containing water to the wafer W. The fourth nozzle 64 supplies the water-repellent agent to the wafer W. The fifth nozzle 65 supplies the removal liquid to remove the stain D generated in the outer peripheral portion of the wafer W by the action of the water-repellent agent and the water. The controller 18 performs the rinse processing of supplying the rinse liquid from the second nozzle 62 and the fifth nozzle 65 to the wafer W, the water-repellency processing of supplying the water-repellent agent from the fourth nozzle 64 to the front surface of the wafer W after the rinse processing, the drying processing of drying the wafer W after the water-repellency processing, and the removal liquid supply processing of supplying the removal liquid from the fifth nozzle 65 to the rear surface, during the water-repellency processing or between the water-repellency processing and the drying processing.

Thus, even though a stain D is generated in the outer peripheral portion of the rear surface of the wafer W, the stain D may be removed. Accordingly, it is possible to suppress the pattern collapse of the wafer W, as well as to provide a wafer W having no stain D on the rear surface.

Here, descriptions have been made on the case where the processing unit 16 performs the removal liquid supply processing instead of the water removal processing. However, the processing unit 16 may perform both the water removal processing and the removal liquid supply processing. Accordingly, the generation of the stain D may be more reliably suppressed.

Sixth Exemplary Embodiment

Figure 14A:
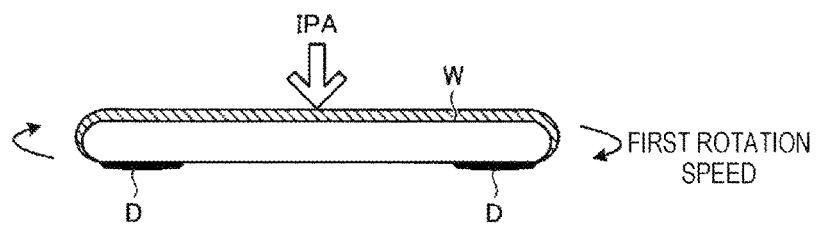
FIG. 14A is an explanatory view of the second substitution processing.

In the above-described fifth exemplary embodiment, as a method of supplying the removal liquid to the rear surface of the wafer W in the removal liquid supply processing, descriptions have been made on the case of supplying the removal liquid from the fifth nozzle 65 to the rear surface of the wafer W. However, the method of supplying the removal liquid to the rear surface of the wafer W is not limited to the above-described case. Thus, hereinafter, a modification of the removal liquid supply processing will be described with reference to FIGS. 14A and 14B. FIG. 14A is an explanatory view of a second substitution processing, and FIG. 14B is an explanatory view of a removal liquid supply processing according to a modification.

As illustrated in FIG. 14A, the processing unit 16 ejects IPA from the third nozzle 63 to the front surface of the rotating wafer W for a predetermined period of time while rotating the wafer W at a first rotation speed in the second substitution processing. The rotation speed of the wafer W in the processings of steps S202 to S205 illustrated in FIG. 12 is also the first rotation speed.

Subsequently, the processing unit 16 performs the removal liquid supply processing. Specifically, the processing unit 16 changes the rotation speed of the wafer W to a second rotation speed that is lower than the first rotation speed during the second substitution processing.

Figure 14B:
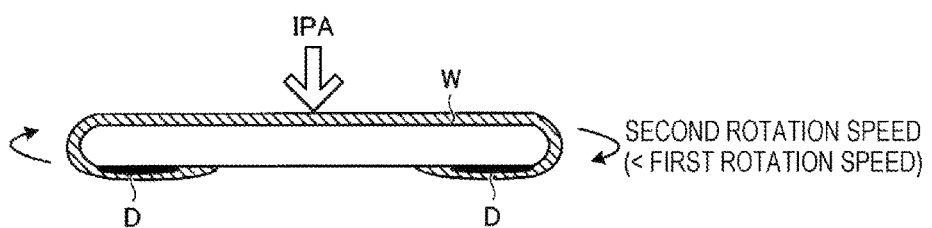
FIG. 14B is an explanatory view of a removal liquid supply processing according to a modification.

As illustrated in FIG. 14B, as the rotation speed of the wafer W is decreased, the IPA supplied to the front surface of the wafer W flows from the front surface of the wafer W to the rear surface. Therefore, the IPA is supplied to the stain D generated in the outer peripheral portion of the rear surface of the wafer W (see, e.g., FIG. 2), so that the stain D is removed.

As such, the removal liquid supply processing according to the sixth exemplary embodiment is configured to supply the IPA supplied to the front surface of the wafer W as a removal liquid so as to flow around to the rear surface of the wafer by changing the rotation speed of the wafer W to the second rotation speed that is lower than the first rotation speed during the second substitution processing. Therefore, the stain D generated in the outer peripheral portion of the rear surface of the wafer W may be efficiently removed.

Seventh Exemplary Embodiment

Figure 15:
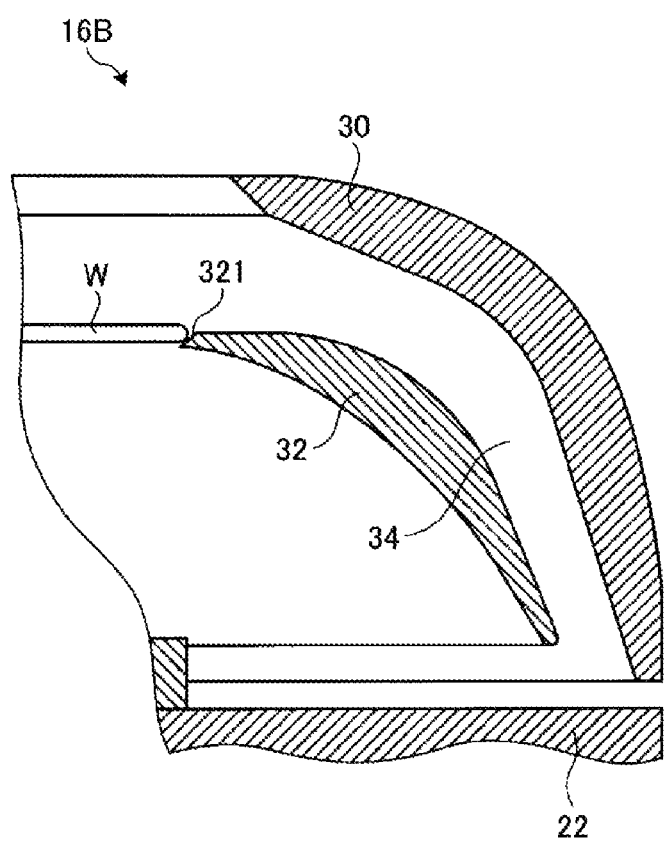
FIG. 15 is a view illustrating an exemplary configuration of a processing unit according to a seventh exemplary embodiment.

Next, a configuration of a processing unit according to the seventh exemplary embodiment will be described with reference to FIG. 15. FIG. 15 is a view illustrating an exemplary configuration of a processing unit according to a seventh exemplary embodiment.

As illustrated in FIG. 15, a processing unit 16B according to the seventh exemplary embodiment includes, as rotary cups, an outer annular rotary cup 30 and an inner annular rotary cup 32. The outer rotary cup 30 and the inner rotary cup 32 are attached to the base 22 of the substrate holding unit 20 through a pillar (not illustrated), and rotated integrally with the base 22. A flow path 34 is formed between the outer rotary cup 30 and the inner rotary cup 32, so that the atmosphere above the wafer W is drawn into the outer rotary cup 30 through the flow path 34. The inner circumferential surface of the outer rotary cup 30 receives a processing liquid shaken off and scattered from the wafer W after being supplied to the wafer W, and guides the processing liquid to the cup 40 (see, e.g., FIG. 3). In addition, the inner rotary cup 32 suppresses a fluid including the processing liquid flowing through the flow path 34 from flowing around to the rear surface of the wafer W. Further, the inner rotary cup 32 guides an air current generated in the space between the base 22 and the rear surface of the wafer W, which is attended by the rotation of the substrate holding unit 20, to the cup 40.

A tapered surface 321 is formed in the upper edge portion of the inner rotary cup 32 to be gradually narrowed downwardly. The processing unit 16B holds the wafer W by locking a bevel portion of the wafer W to the tapered surface 321.

The tapered surface 321 is formed over the entire circumference of the wafer W. That is, since the bevel surface of the wafer W is in contact with the tapered surface 321 over the entire circumference of the wafer W, the atmosphere of the water-repellent agent generated at the front surface side of the wafer W is suppressed from flowing around to the rear surface of the wafer W in the water-repellency processing. Accordingly, even though water is present in the outer peripheral portion of the wafer W, the atmosphere of the water-repellent agent and the water hardly come in contact with each other. Thus, the generation of the stain D may be suppressed.

Here, descriptions have been made on the case where the atmosphere of the water-repellent agent is made difficult to flow around to the rear surface of the wafer W by separating the space of the front surface side of the wafer W and the space of the rear surface side are separated from each other. However, without being limited thereto, the atmosphere of the water-repellent agent may be made difficult to flow around to the rear surface of the wafer W by increasing the exhaust amount from the cup exhaust port 45 or the housing exhaust port 72.

In the above-described exemplary embodiments, descriptions have been made on the case where the first surface cleaning processing and the second surface cleaning processing are performed at the same time. However, the first surface cleaning processing and the second surface cleaning processing are not necessarily performed at the same time.

Further, in the above-described exemplary embodiments, descriptions have been made on the case where the first cleaning liquid and the second cleaning liquid are identical to each other. However, the first cleaning liquid and the second cleaning liquid are not necessarily identical to each other.

Further, in the above-described exemplary embodiments, descriptions have been made on the case where the first cleaning liquid and the second cleaning liquid are DIW. However, the first cleaning liquid and the second cleaning liquid may be a cleaning liquid containing water, a cleaning liquid other than DIW, for example, DIW heated at a predetermined temperature (HDIW), SC1 (a mixture of ammonia/hydrogen peroxide/water), or SC2 (a mixture of hydrochloric acid/hydrogen peroxide/water).

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing method comprising:
   supplying a first cleaning liquid containing water to a first surface of a substrate while the substrate is being rotated, thereby cleaning the first surface of the substrate;
   supplying a second cleaning liquid containing water to a second surface of the substrate that is opposite to the first surface of the substrate while the substrate is being rotated and the first cleaning liquid is being supplied to the first surface of the substrate, thereby cleaning the second surface of the substrate;
   supplying a rinsing liquid to the first surface of the substrate and the second surface of the substrate while the substrate is being rotated, thereby rinsing the first cleaning liquid and rinsing the second cleaning liquid;
   stopping the supplying of the rinsing liquid to the second surface of the substrate at a predetermined time, continuing the rinsing of the first surface of the substrate after stopping the rinsing of the second surface of the substrate and thereafter supplying an organic solvent to the first surface of the substrate to substitute the rinsing liquid on the first surface such that the first surface of the substrate is not exposed to outside air while the substrate is continuously rotated, thereby removing the rinsing liquid remaining on the first surface of the substrate by the organic solvent and removing the rinsing liquid remaining on the second surface of the substrate by a centrifugal force;
   supplying a water-repellent agent to the first surface of the substrate while the substrate is being rotated; and
   after the supplying the water-repellent agent to the first surface of the substrate, increasing a rotation speed of the substrate thereby drying the substrate.

2. The substrate processing method of claim 1, wherein, in the removing of the rinsing liquid remaining on the second surface of the substrate, a gas is supplied to the second surface of the substrate while the rinsing liquid is supplied to the first surface of the substrate.

3. The substrate processing method of claim 1, wherein the water-repellent agent is a silylating agent.

4. The substrate processing method of claim 1, further comprising:
   after the supplying the water-repellent agent and before the increasing the rotation speed of the substrate, supplying an organic solvent to the first surface of the substrate to substitute the water-repellent agent remaining on the first surface with the organic solvent.

5. A substrate processing method comprising:
   supplying a first cleaning liquid containing water to a first surface of a substrate while the substrate is being rotated, thereby cleaning the first surface of the substrate;
   supplying a second cleaning liquid containing water to a second surface of the substrate that is opposite to the first surface of the substrate while the substrate is being rotated and the first cleaning liquid is being supplied to the first surface of the substrate, thereby cleaning the second surface of the substrate;
   supplying a rinsing liquid to the first surface of the substrate and the second surface of the substrate while the substrate is being rotated, thereby rinsing the first cleaning liquid and the second cleaning liquid,
   after the supplying of the rinsing liquid to the first surface of the substrate and the second surface of the substrate is stopped, supplying an organic solvent to the first surface of the substrate such that the first surface of the substrate is not exposed to outside air while the substrate is continuously rotated, thereby removing the rinsing liquid remaining on the first surface of the substrate by the organic solvent and supplying a gas to only the second surface of the substrate while the organic solvent is supplied to the first surface of the substrate thereby removing the rinsing liquid remaining on the second surface of the substrate;
   supplying a water-repellent agent to the first surface of the substrate while the substrate is being rotated; and
   after the supplying the water-repellent agent to the first surface of the substrate, increasing a rotation speed of the substrate thereby drying the substrate.

6. The substrate processing method of claim 5, wherein the gas is supplied obliquely toward an outer peripheral portion of the second surface of the substrate.

7. The substrate processing method of claim 5, wherein the gas is supplied from an ejecting port that is positioned directly below an outer peripheral portion of the second surface of the substrate.

8. A substrate processing method comprising:
   supplying a cleaning liquid containing water to a first surface of a substrate while the substrate is being rotated thereby cleaning the substrate;
   supplying a second cleaning liquid containing water to a second surface of the substrate that is opposite to the first surface of the substrate while the substrate is being rotated and the first cleaning liquid is being supplied to the first surface of the substrate, thereby cleaning the second surface of the substrate;
   supplying a rinsing liquid to the first surface of the substrate and the second surface of the substrate while the substrate is being rotated, thereby rinsing the first cleaning liquid and the second cleaning liquid,
   after the supplying of the rinsing liquid to the substrate is completed, supplying a water-repellent agent to the first surface of the substrate in a state where the rinsing liquid remains present on a second surface of the substrate that is opposite to the first surface of the substrate while the substrate is being rotated, such that a stain is generated on the second surface of the substrate by the water-repellent agent and the rinsing liquid, wherein the rinsing liquid is deionized water;
   supplying an organic solvent to the first surface of the substrate while rotating the substrate at a first rotation speed for a predetermined period of time; and
   changing a rotation speed of the substrate to a second rotation speed lower than the first rotation speed, so that the organic solvent supplied to the first surface of the substrate flows around to the second surface thereby removing the generated stain.

* * * * *